US012694928B2

(12) United States Patent
Ong et al.

(10) Patent No.: US 12,694,928 B2
(45) Date of Patent: Jul. 28, 2026

(54) EPITAXIAL LAYERS OF A TRANSISTOR ELECTRICALLY COUPLED WITH A BACKSIDE CONTACT METAL

(71) Applicant: Intel Corporation, Santa Clara, CA (US)

(72) Inventors: Clifford Ong, Portland, OR (US); Leonard P. Guler, Hillsboro, OR (US); Smita Shridharan, Beaverton, OR (US); Zheng Guo, Portland, OR (US); Charles H. Wallace, Portland, OR (US); Eric A. Karl, Portland, OR (US); Mauro J. Kobrinsky, Portland, OR (US); Shem O. Ogadhoh, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 351 days.

(21) Appl. No.: 17/710,942

(22) Filed: Mar. 31, 2022

(65) Prior Publication Data

US 2023/0317148 A1     Oct. 5, 2023

(51) Int. Cl.
| | |
|---|---|
| *G11C 11/417* | (2006.01) |
| *G11C 11/412* | (2006.01) |
| *H10B 10/00* | (2023.01) |

(52) U.S. Cl.
CPC .......... *G11C 11/417* (2013.01); *G11C 11/412* (2013.01); *H10B 10/12* (2023.02)

(58) Field of Classification Search
CPC ..... G11C 11/412; G11C 11/417; H10B 10/12; H10D 30/0198; H10D 30/43; H10D 30/6735; H10D 64/251; H10D 84/834; H10D 84/0158
See application file for complete search history.

(56) References Cited

U.S. PATENT DOCUMENTS

| | | | |
|---|---|---|---|
| 2020/0105753 A1* | 4/2020 | Kotlyar | H10D 30/6757 |
| 2021/0028112 A1* | 1/2021 | Kim | H10D 86/215 |
| 2021/0057325 A1 | 2/2021 | Chou | |
| 2021/0358891 A1 | 11/2021 | Chuang | |
| 2021/0375883 A1* | 12/2021 | Hsu | H10B 10/12 |

(Continued)

FOREIGN PATENT DOCUMENTS

CN     114121784 A     3/2022

OTHER PUBLICATIONS

Search Report from European Patent Application No. 23157084.7, mailed Sep. 11, 2023, 7 pgs.

(Continued)

*Primary Examiner* — Tuan A Hoang
(74) *Attorney, Agent, or Firm* — Schwabe, Williamson & Wyatt, P.C.

(57) ABSTRACT

Embodiments described herein may be related to apparatuses, processes, systems, and techniques directed to electrical couplings between epitaxial structures and voltage sources within transistors in SRAM bit cells. Embodiments include direct electrical couplings between a backside contact metal ( BM0) and a backside of an epitaxial structure, as well as electrical connection structures that electrically couple the BM0 to a front side of an epitaxial structure. Other embodiments may be described and/or claimed.

17 Claims, 13 Drawing Sheets

(56)         References Cited

U.S. PATENT DOCUMENTS

| | | | |
|---|---|---|---|
| 2022/0028786 A1 | 1/2022 | Huang | |
| 2022/0037236 A1* | 2/2022 | Seo | H10W 20/20 |
| 2022/0058327 A1* | 2/2022 | Yang | H10D 30/0243 |

OTHER PUBLICATIONS

Office Action from European Patent Application No. 23157084.7, mailed Jan. 20, 2026, 6 pgs.

* cited by examiner

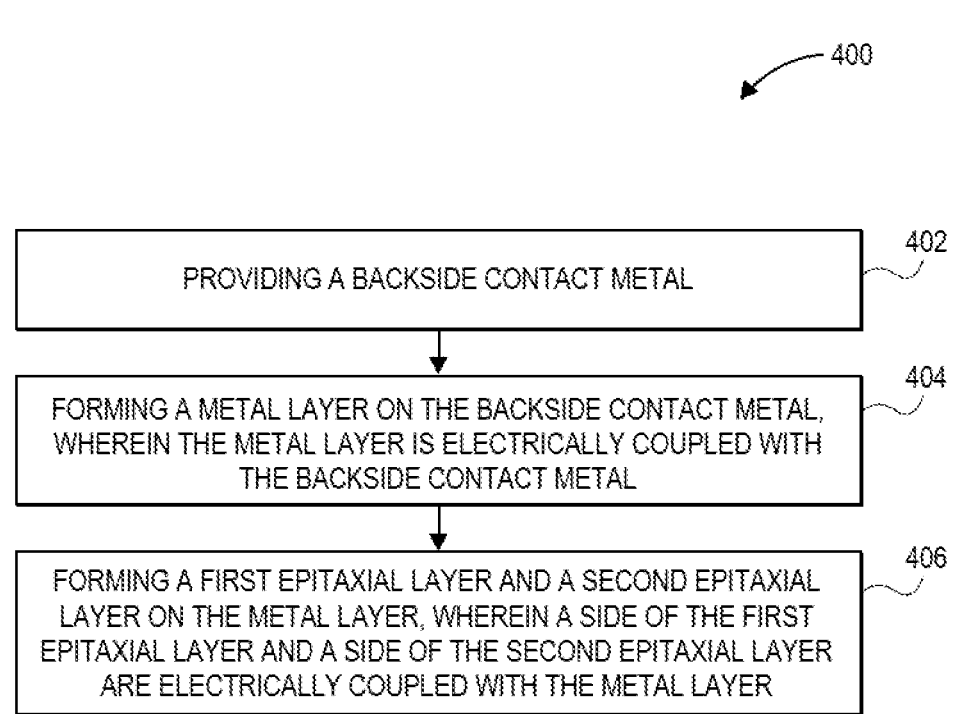

400

| PROVIDING A BACKSIDE CONTACT METAL | 402 |

| FORMING A METAL LAYER ON THE BACKSIDE CONTACT METAL, WHEREIN THE METAL LAYER IS ELECTRICALLY COUPLED WITH THE BACKSIDE CONTACT METAL | 404 |

| FORMING A FIRST EPITAXIAL LAYER AND A SECOND EPITAXIAL LAYER ON THE METAL LAYER, WHEREIN A SIDE OF THE FIRST EPITAXIAL LAYER AND A SIDE OF THE SECOND EPITAXIAL LAYER ARE ELECTRICALLY COUPLED WITH THE METAL LAYER | 406 |

FIG. 4

EPITAXIAL LAYERS OF A TRANSISTOR ELECTRICALLY COUPLED WITH A BACKSIDE CONTACT METAL

FIELD

Embodiments of the present disclosure generally relate to the field of semiconductor packaging, and in particular to static random-access memory (SRAM) with epitaxial layers electrically coupled with a backside contact metal.

BACKGROUND

Continued growth in virtual machines, cloud computing, and portable devices will continue to increase the demand for high density transistors within chips and packages. In particular, transistors commonly use multiple front side metal layers and a deep boundary via (DVB) ring to provide VSS to the front side of epitaxial layers. These transistor implementations consume multiple front side metal layer resources and also result in a resistive voltage drop.

BRIEF DESCRIPTION OF THE DRAWINGS

FIG. 4 illustrates an example process for manufacturing and SRAM that includes an epitaxial layer that is electrically coupled with a backside contact metal, in accordance with various embodiments.

DETAILED DESCRIPTION

Figure 1A:
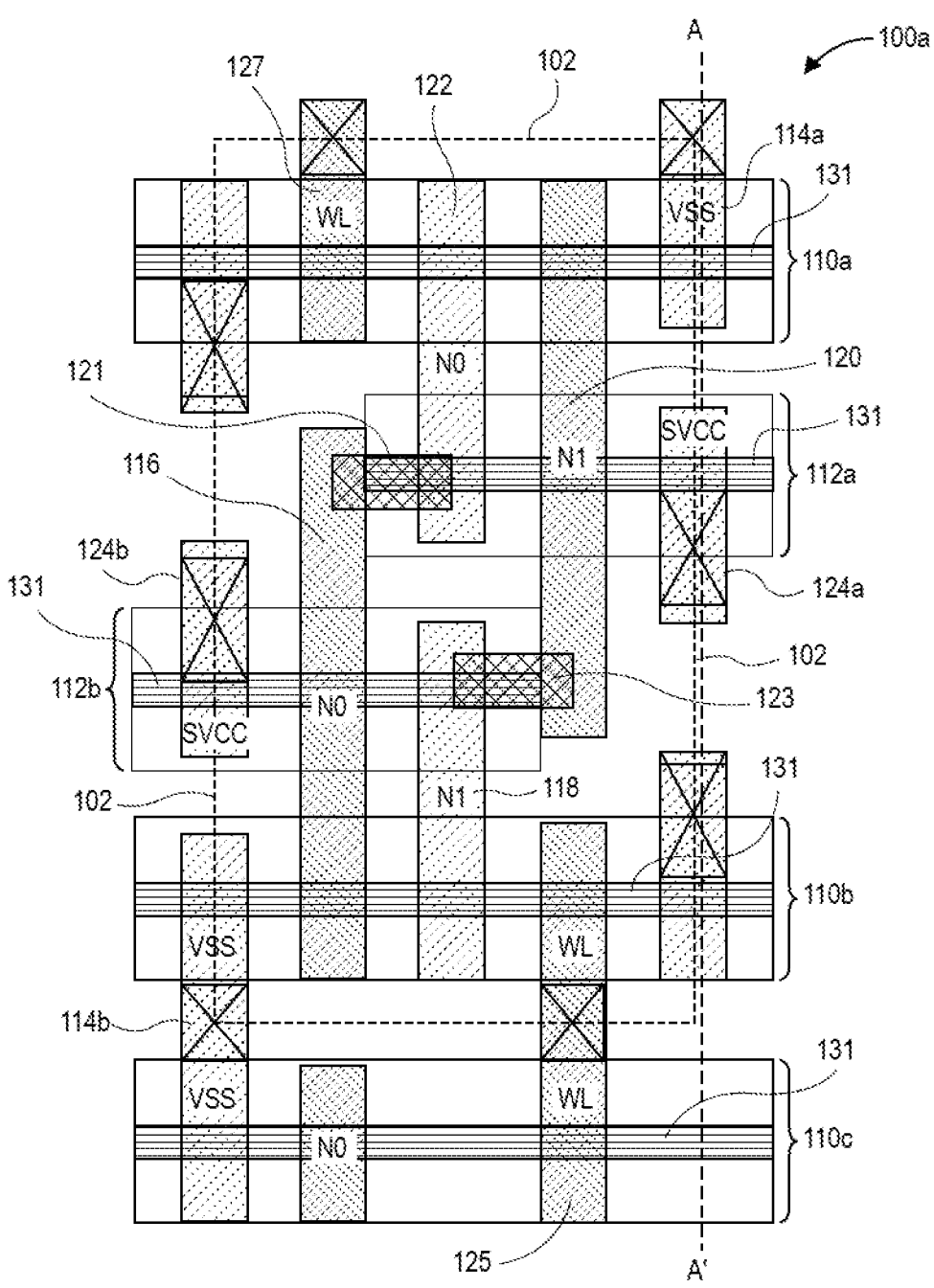
FIGS. 1A-1C show a top-down view and a cross-section side view of a legacy SRAM cell that includes six transistors and that is next to a portion of another SRAM cell.

Embodiments described herein may be related to apparatuses, processes, systems, and techniques directed to electrical couplings between epitaxial structures and voltage sources within SRAM bit cells, which may also be referred to as an SRAM cell. Epitaxial structures are components of transistors that are used to form the source and drain terminals and are included in larger structures, such as inverters, within an SRAM cell. Embodiments may include electrical couplings and/or direct electrical couplings between a backside metal 0 layer (BM0) of a transistor and a backside of an epitaxial structure within a transistor. In embodiments, these electrical couplings may be referred to as backside metal contacts. In embodiments, these backside metal contacts may include several layers of backside metal contacts that may be proximate and/or adjacent to each other.

Embodiments may also include electrical connection structures that electrically couple the BM0 to a front side of an epitaxial structure. Embodiments provide these electrical couplings to electrically connect an NMOS epitaxial structure with a voltage source or a voltage ground (VSS), where these electrical couplings minimize a distance between the VSS and the various NMOS epitaxial structures.

In embodiments, the shorter electrical distance between the BM0, or a backside contact, and the epitaxial structure may significantly reduce the amount of metal that is included in front side metal layers that provide these electrical connections required in legacy implementations. These legacy front side electrical connections typically route in a front side, for example in the metal layer 2 to metal layer 4 layers. Legacy implementations may use a deep boundary via (DVB) ring around an array of SRAM bit cells that electrically couple with these legacy front side electrical connections to provide VSS to the SRAM bit cells. These legacy implementations, in addition to consuming multiple front side metal layer resources, also create a resistive voltage drop to the respective bit cells.

In particular, embodiments described herein provide a more direct electrical path from the NMOS epitaxial structure to ground to increase the SRAM bit cell read current ($I_{READ}$), a key SRAM metric that directly influences the speed of the SRAM read operation and therefore, overall SRAM performance. Embodiments may also reduce bit line and word line capacitance by reducing the number of front side electrical connections required in legacy implementations as described above, thereby improving the overall memory performance.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Figure 1B:
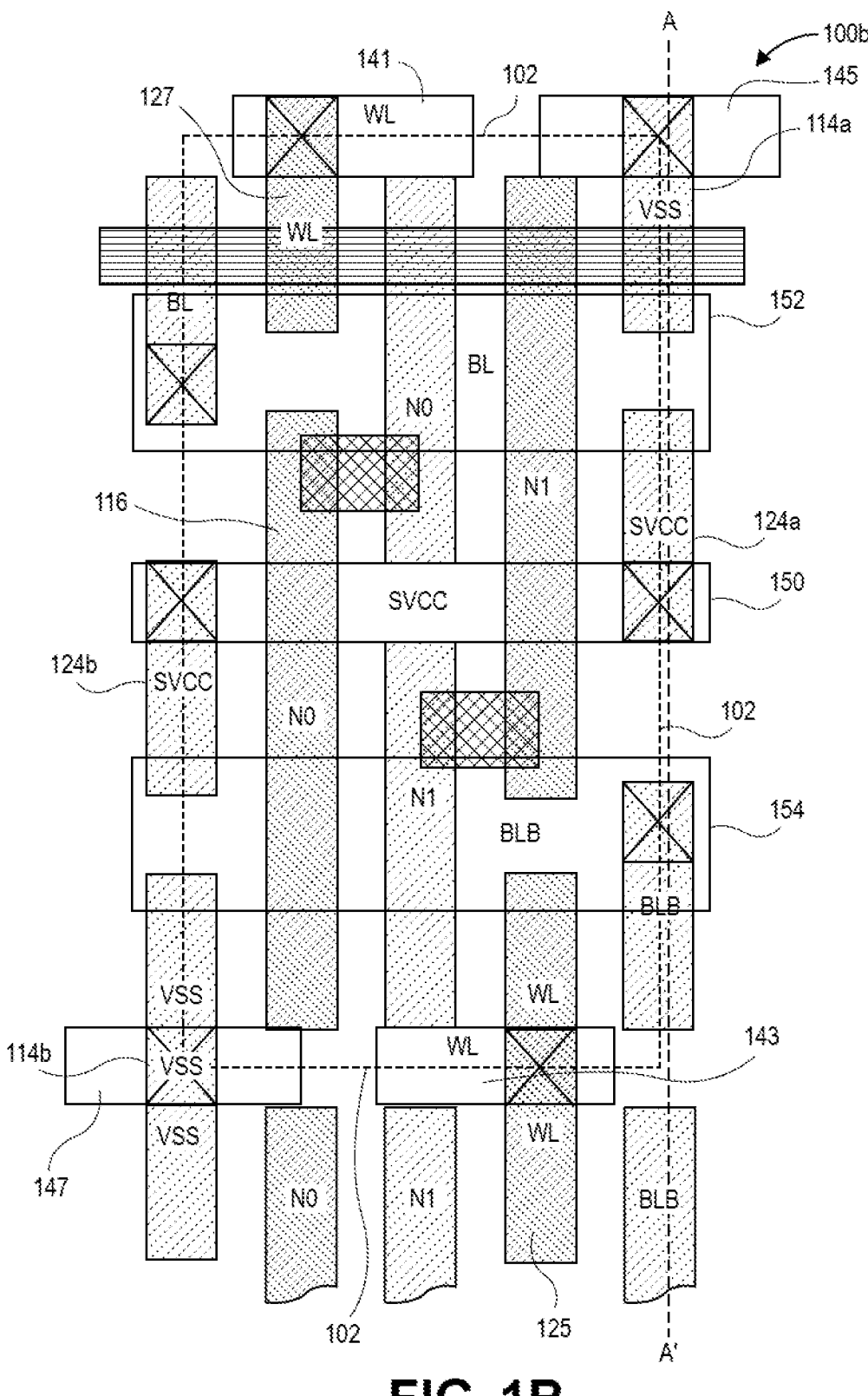
Figure 1C:
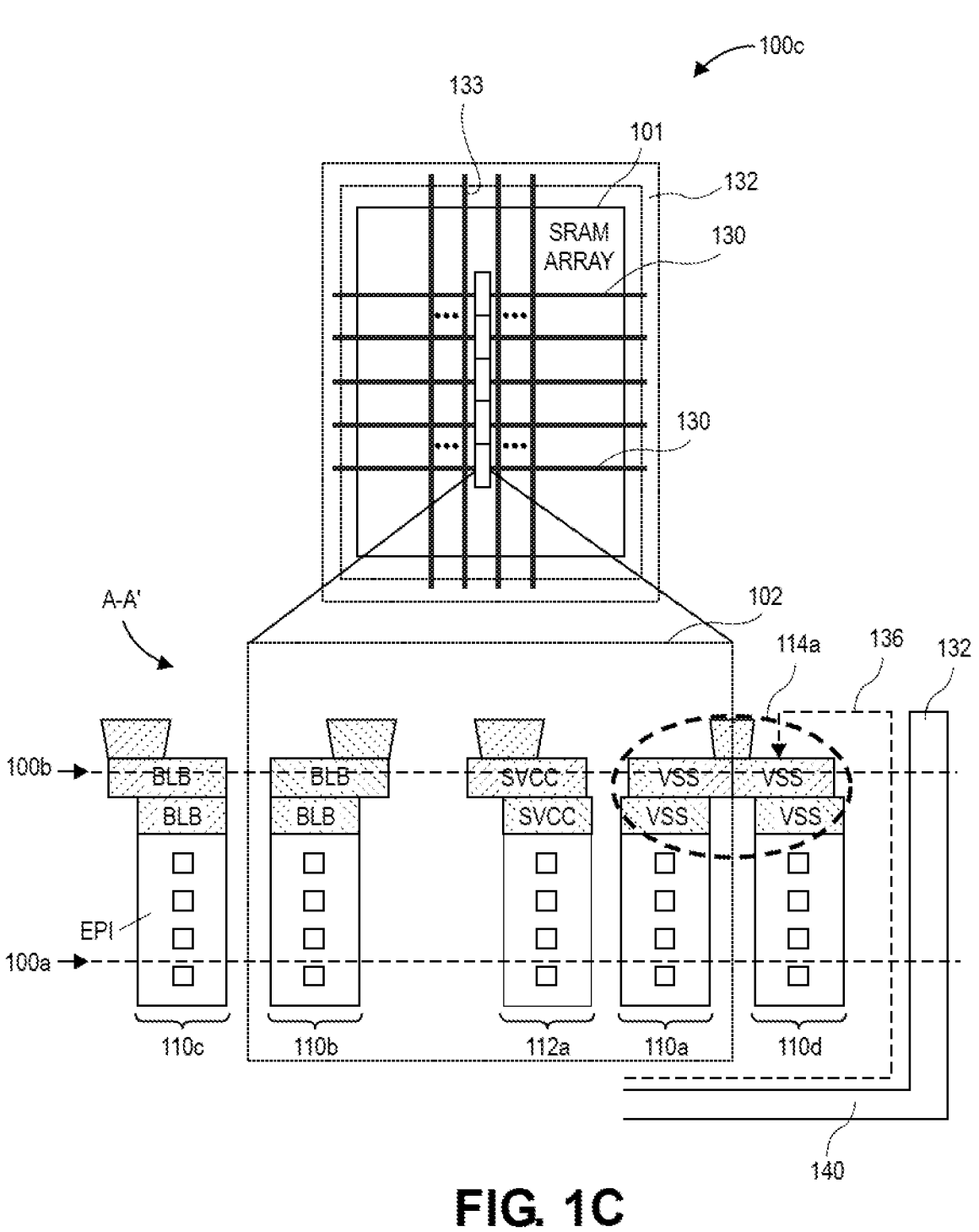

FIGS. 1A-1C show a top-down view and a cross-section side view of a legacy SRAM cell that includes six transistors and that is next to a portion of another SRAM cell. Diagram 100a of FIG. 1A and diagram 100b of FIG. 1B show a top-down cross-section view of a legacy SRAM cell 102, at different layers 100a, 100b as shown in diagram 100c of FIG. 1C. Diagram 100a shows base layers, and diagram 100b shows the metal 0 (M0) layer.

FIG. 1A includes diagram 100a that shows a top-down view of a legacy SRAM cell 102 that includes NMOS epitaxial layers 110a, 110b and PMOS epitaxial layers 112a, 112b. In legacy implementations, VSS connection 114a provides a ground connection to the NMOS epitaxial layers 110a, 110d, and VSS connection 114b provides a ground connection to the NMOS epitaxial layers 110b, 110c. Note that the NMOS epitaxial layers 110b, 110c are in a different SRAM cell other than SRAM cell 102, but share a same VSS connection 114a, 114b with SRAM cell 102. Various nanoribbons 131 are shown in the various epitaxial layers 110a, 110b, 110c, 112a, 112b.

In legacy implementations, SVCC connection 124a electrically couples with PMOS epitaxial layer 112a, and SVCC connection 124b electrically couples with PMOS epitaxial layer 112b. The SVCC connections 124a, 124b are electrically coupled with a front side layer discussed further with respect to FIG. 1B, and are electrically coupled with a SVCC fixed or variable voltage source (not shown).

The SRAM cell 102 forms a cross-coupled inverter, with a first inverter including a poly gate (N0) 116 as an input and trench contact (N1) 118 as output, a second inverter including a poly gate (N1) 120 as an input and a trench contact (N0) 122 as output, a pair of gate to trench contacts 121, 123 that electrically couple the first inverter output to the second inverter input (N0 116 to N0 122), and the second inverter input to the first inverter output (N1 120 to N1 118), a first poly gate (WL) 127 of the passgate transistor that electrically couples N0 122 with the bitline (BL), and a second poly gate (WL) 125 of the passgate transistor that electrically couples N1 118 with a bitline_bar (BLB).

FIG. 1B includes diagram 100b that shows a cross-section of the SRAM cell 102 at layer 100b as shown in diagram 100c of FIG. 1C, at the front side of the SRAM cell 102. Legacy VSS structures 114a, 114b are shown, as well as SVCC structures 124a, 124b that are electrically coupled with a SVCC connector 150. This layer also includes bit line 152, and bit line bar 154. This layer also includes the wordline metal 0 layers 141, 143 that control, respectively, the passgates 127, 125 and VSS metal 0 layers 145, 147 that electrically couple, respectively, with VSS trench contacts 114a,114b.

FIG. 1C includes diagram 100c that shows a top-down schematic of a plurality of SRAM cells that make up an SRAM array 101, that includes an SRAM cell 102. The diagram marked A-A' is a cross-section side view of SRAM cell 102 of A-A' in FIG. 1A or FIG. 1B.

The electrical coupling 130 in legacy implementations, as referred to above, is implemented across the front side of the SRAM array 101, and is used to electrically couple a VSS reference plane 140 with the epitaxial structures 110a, 110b within SRAM cell 102. The electrical coupling 130 may also electrically couple epitaxial structures 110d and 110c that may be outside of SRAM cell 102 in a portion of an adjacent SRAM cell.

In implementations, the electrical coupling 130 extends at the front side of the SRAM cell 102 from an electrically conductive ring 132. Note, electrical coupling is not shown in the A-A' diagram for clarity. In implementations, the conductive ring 132 may be a deep boundary via (DVB) ring that extends from a VSS reference plane 140 below the backside of the SRAM array 101 to the front side of the SRAM array 101.

As a result of this legacy architecture, there are multiple electrical couplings 130 at the front side of the SRAM array 101 that electrically couple with the conductive ring 132 providing power to various VSS connections such as VSS connections 114a, 114b. In legacy implementations, the electrical path 136 has a substantial length, extending from the reference plane 140, through the electrically conductive ring 132, across the electrical coupling 130 to the VSS connection 114a, and down to the NMOS epitaxial layers 110a.

Lines 133 represent the VSS routing on upper metal layers (metal 0, metal 1, metal 2, etc.) from the bit cells 102 to the conductive ring 132 around the array 101. The electrical path from the bit cell VSS, through the upper metal layers metal 0 to metal 4 (for example), to the conductive ring 132 around the array 101, and down from metal 4 (for example) to metal 0 and finally to the backside metal layer 0 (BM0), for example reference plane 140, incurs a significant electrical resistance penalty.

Figure 2A:
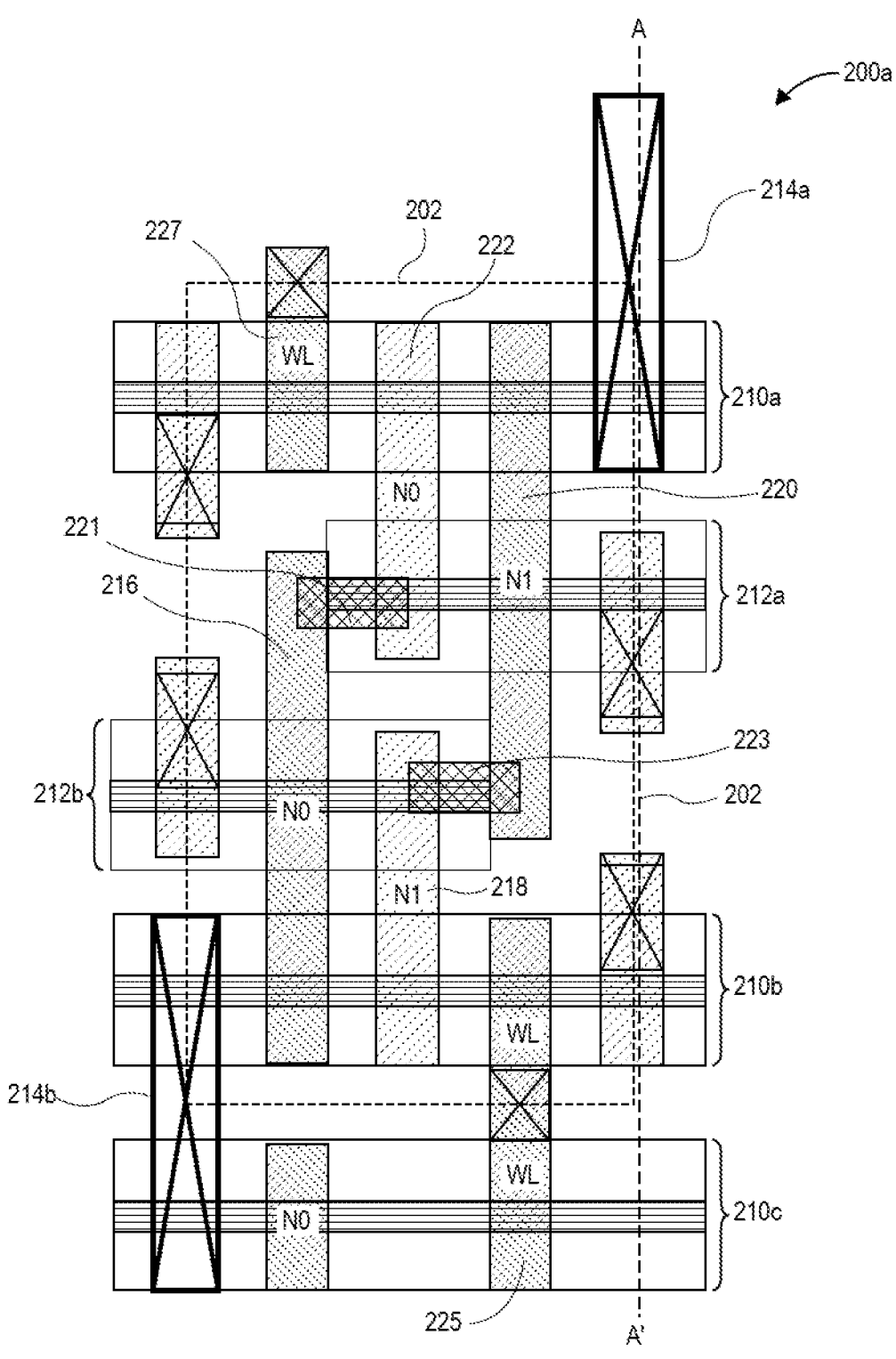
FIGS. 2A-2B show a top-down view and a cross section side view of a SRAM cell that includes an epitaxial layer that is directly electrically coupled with a backside contact metal, in accordance with various embodiments.
Figure 2B:
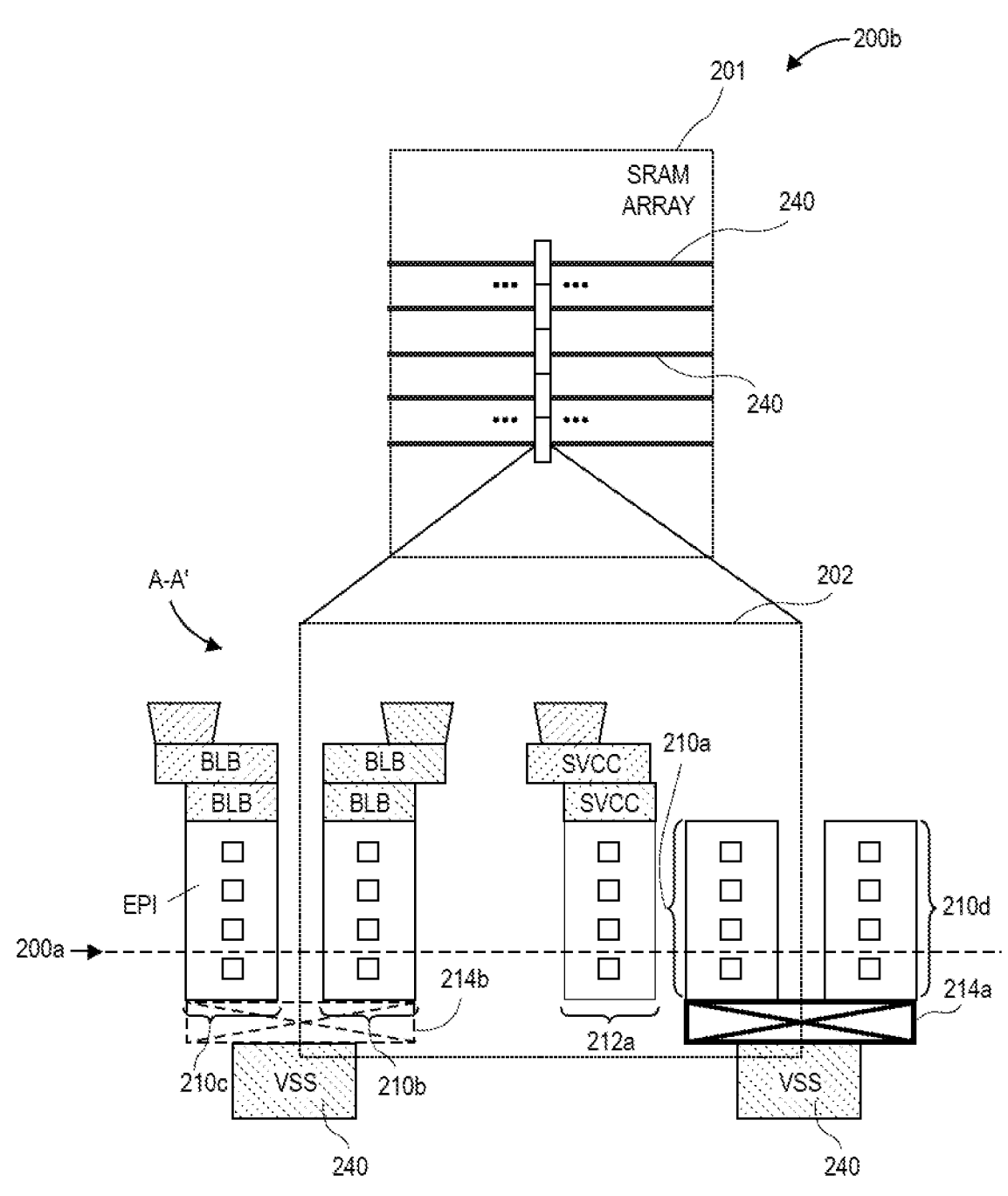

FIGS. 2A-2B show a top-down view and a cross section side view of a SRAM cell that includes an epitaxial layer that is directly electrically coupled with a backside contact metal, in accordance with various embodiments. Diagram

200*a* of FIG. 2A, which may be similar to diagram 100 of FIG. 1A, shows a top-down view of a SRAM cell 202, which may be similar to SRAM cell 102 of FIG. 1A. The SRAM cell 202 includes NMOS epitaxial layers 210*a*, 210*b* and PMOS epitaxial layers 212*a*, 212*b*, which may be similar to NMOS epitaxial layers 110*a*, 110*b* and PMOS epitaxial layers 112*a*, 112*b* of FIGS. 1A-1C.

VSS connection 214*a*, which is at a backside of the SRAM cell 202 and below NMOS epitaxial layers 210*a*, 210*d* (shown in FIG. 2B) provides an electrical connection with a VSS source 240, which may be similar to VSS source 140 of FIG. 1C. The VSS connection 214*b* which is at a backside of NMOS epitaxial layers 210*b*, 210*c*, also provides an electrical connection with the VSS source 240. Note that the NMOS epitaxial layers 210*c* and 210*d* are in a different SRAM cell than SRAM cell 202, but are electrically coupled with the VSS source 240. In embodiments, the VSS connections 214*a*, 214*b* may be implemented using one or more backside metal contacts or backside metal contact layers.

The SRAM cell 202 forms a cross-coupled inverter, with a first inverter including a poly gate (N0) 216 as an input and trench contact (N1) 218 as output, a second inverter including a poly gate (N1) 220 as an input and a trench contact (N0) 222 as output, a pair of gate to trench contacts 221, 223 that electrically couples the first inverter output to the second inverter input (N0 216 to N0 222), and the second inverter input to the first inverter output (N1 220 to N1 218), a first poly gate (WL) 227 of the passgate transistor that electrically couples N0 222 with the bitline (BL), and a second poly gate (WL) 225 of the passgate transistor that electrically couples N1 with the bitline_bar (BLB).

FIG. 2B, diagram 200*b* shows a top-down schematic of a plurality of SRAM cells that make up an SRAM array 201 that includes SRAM cell 202. The diagram marked A-A' is a cross-section side view of SRAM cell 202 of FIG. 2A.

The VSS source 240, which may also be referred to as VSS reference plane, in embodiments is below the NMOS epitaxial layers 210*a*-210*d*. In embodiments, the VSS connections 214*a*, 214*b* may be directly electrically coupled with at least some of the NMOS epitaxial layers 210*a*-210*d*. In embodiments, the VSS connections 214*a*, 214*b* may include an electrically conductive material, which may include a metal such as but not limited to copper, gold, or aluminum, or may include an electrically conductive metal alloy.

Note that unlike the legacy diagram 100*a* in FIG. 1, there is no electrically conductive ring 132 that surrounds the SRAM array 201, nor are there any front side electrical couplings 130 to electrically couple the conductive ring 132 with the epitaxial layers 210*a*, 210*d* to provide a VSS reference in this embodiment. As a result, the electrical path between the VSS source 240 and a bottom side of the NMOS epitaxial layers 210*a*-210*d* is vastly shorter than legacy electrical path 136 of FIG. 1C. In addition, the absence of front side VSS electrical couplings 130 eliminates the layer-to-layer and inter-layer coupling capacitance between bitline or word line and VSS routes.

In embodiments, the VSS connections 214*a*, 214*b* may be within one or more layers of a trench connector network that may exist at or above the VSS source 240 and below the epitaxial layers 210*a*, 210*d*. It should also be appreciated that, in other embodiments, structures similar to the VSS connections 214*a*, 214*b* may be used to provide power or ground to other components within the SRAM array 201.

Figure 3A:
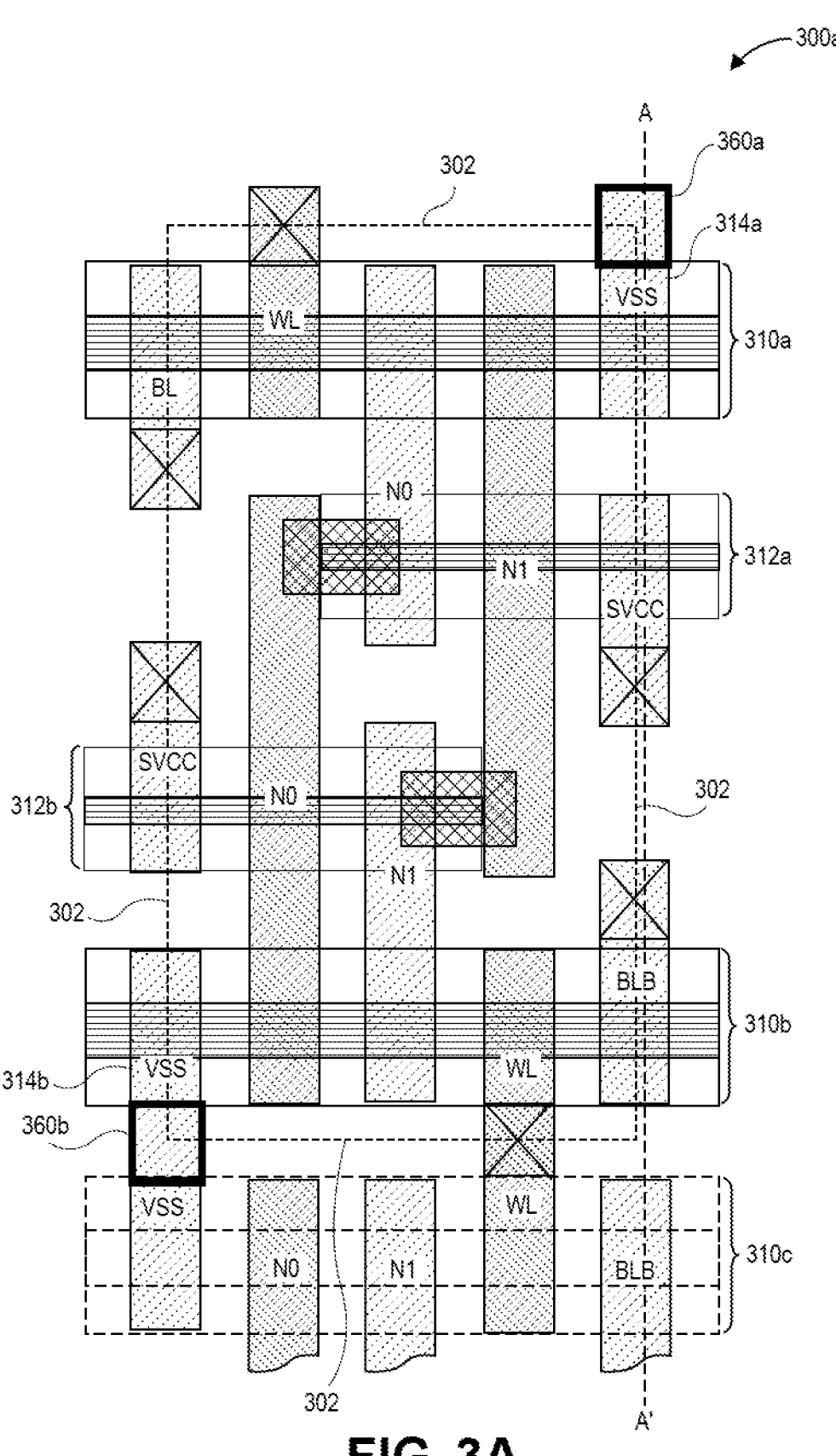
FIGS. 3A-3C show multiple top-down views and a cross section side view of an SRAM cell that includes a deep trench connector to electrically couple the top of an epitaxial layer with a backside contact metal, in accordance with various embodiments.
Figure 3B:
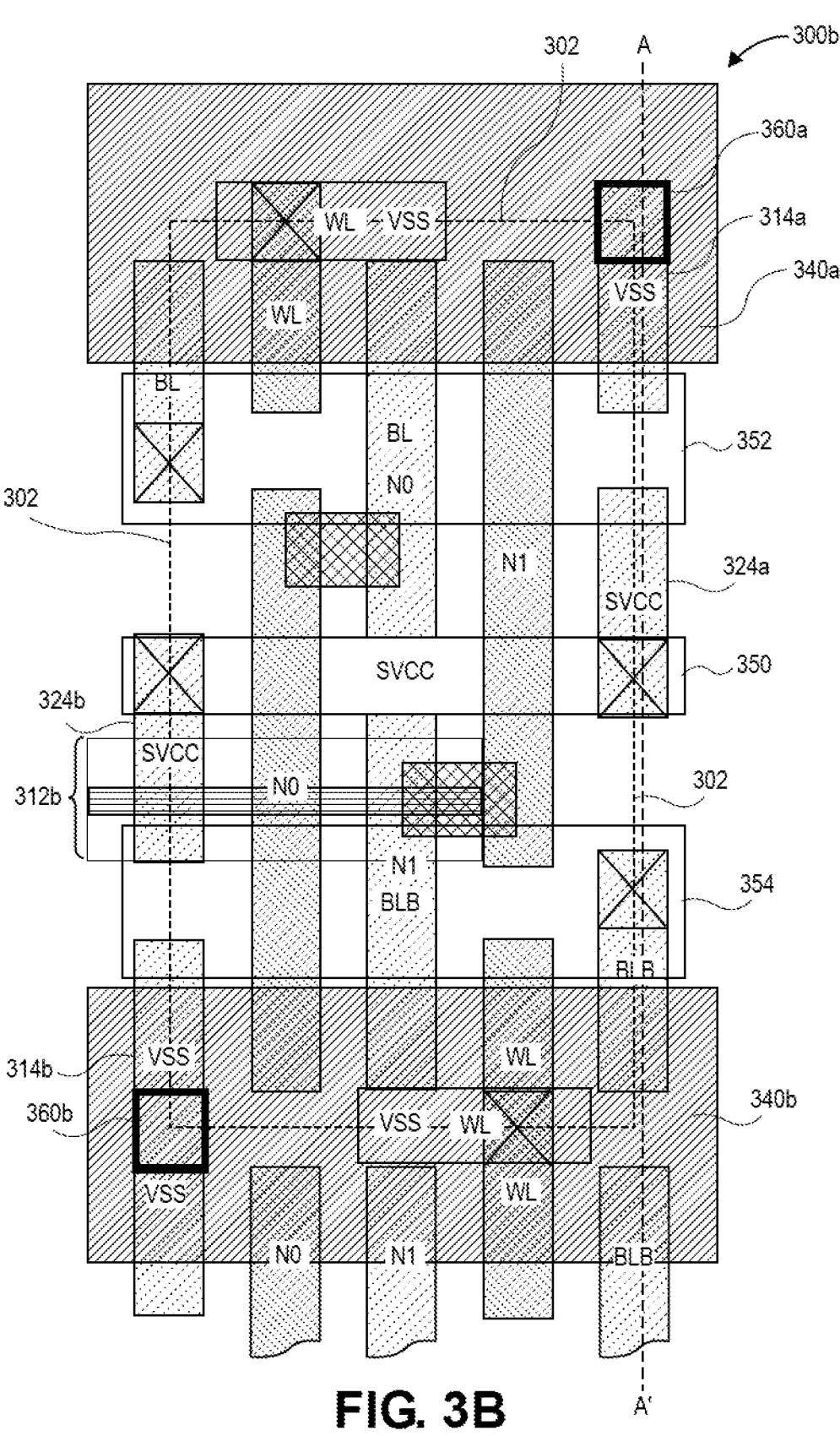
Figure 3C:
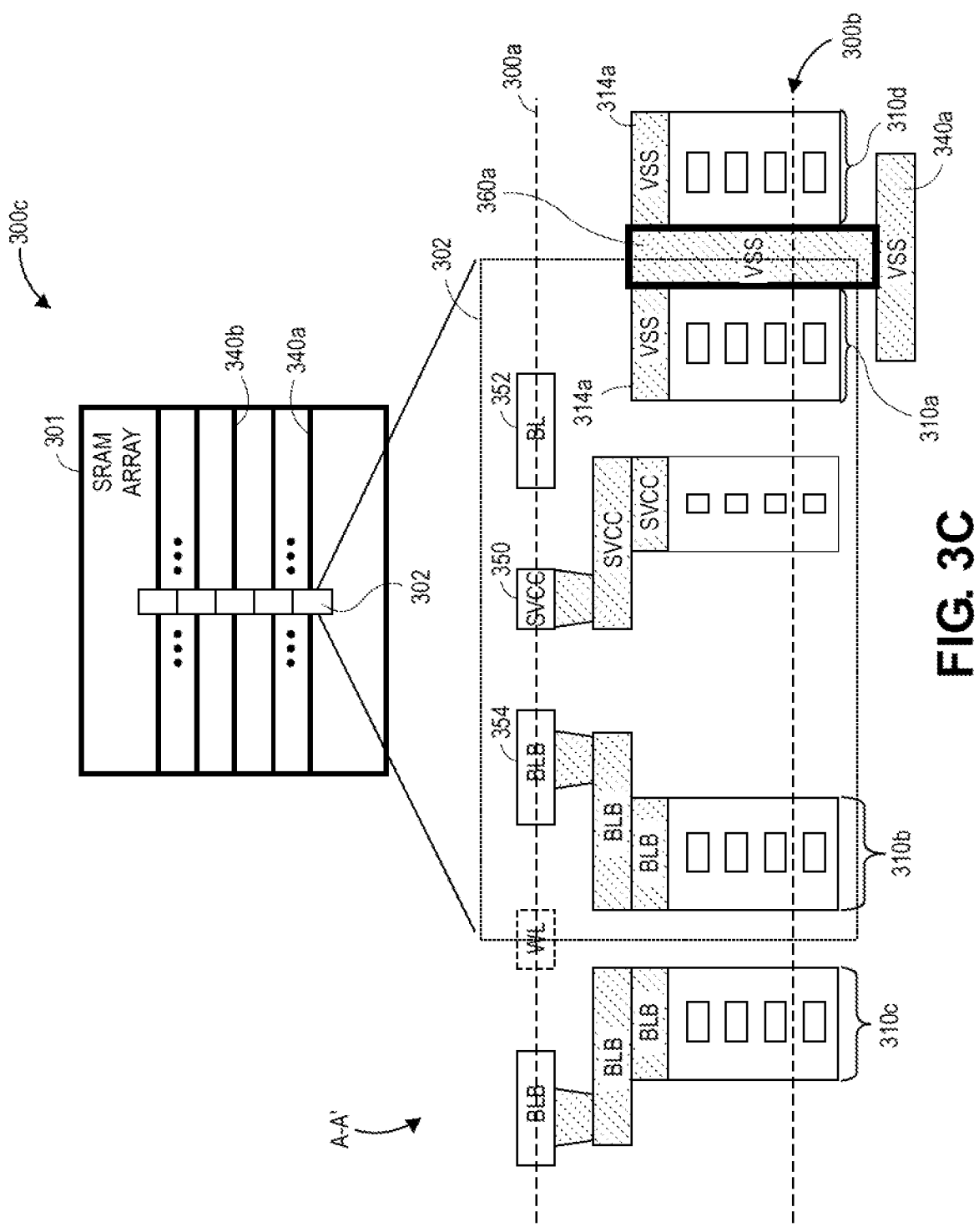

FIGS. 3A-3C show multiple top-down views and a cross section side view of an SRAM cell that includes a deep trench connector to electrically couple the top of an epitaxial layer with a backside contact metal, in accordance with various embodiments.

FIG. 3A shows multiple top-down views of an SRAM cell that includes a deep trench connector to electrically couple the top of an epitaxial layer with a backside contact metal, in accordance with various embodiments. Diagrams 300*a*, 300*b* show a top-down view of embodiments of a SRAM cell 302 at different layers 300*a*, 300*b* as shown in diagram 300*c* of FIG. 3C. Diagram 300*a* includes NMOS epitaxial layers 310*a*, 310*b*, which may be similar to epitaxial layers 210*a*, 210*b* of FIG. 2A, and PMOS epitaxial layers 312*a*, 312*b*, which may be similar to epitaxial layers 212*a*, 212*b* of FIG. 2A.

In embodiments as shown, VSS connection 314*a* provides an electrical connection to the NMOS epitaxial layer 310*a*, and VSS connection 314*b* provides an electrical connection to the NMOS epitaxial layers 310*b* and 310*c*. Note that the NMOS epitaxial layer 310*c* is in a different SRAM cell than SRAM cell 302. The SRAM cell 302 forms a cross-coupled inverter, which is similar to SRAM cell 202 of FIGS. 2A-2B as described above.

In embodiments, deep trench connector 360*a* extends from VSS connection 314*a* down through the SRAM array 301 to the VSS reference plane 340*a*, which may be similar to VSS reference plane 240 of FIG. 2B, and electrically couples the VSS connection 314*a* with the VSS reference plane 340*a* of FIG. 3C. Similarly, deep trench connector 360*b* extends from VSS connection 314*b* to VSS reference plane 340*b*, and electrically couples the VSS connection 314*b* with the VSS reference plane 340*b* of FIG. 3C. Note that in embodiments, VSS reference planes 340*a*, 340*b* may be electrically coupled and may be in a same plane. In embodiments, the deep trench connectors 360*a*, 360*b* may be created by using an etch process to create a via or hole that is subsequently filled with an electrically conductive material, such as a metal.

FIG. 3B includes diagram 300*b* that shows a cross-section of the SRAM cell 302 at layer 300*b* as shown in diagram 300*c* of FIG. 3C. Diagram 300*b* may be similar to diagram 100*b* of FIG. 1B. VSS structures 314*a*, 314*b* are included, as well as SVCC contacts 324*a*, 324*b* that are electrically coupled with SVCC connector 350, which may be similar to SVCC connector 150 of FIG. 1B. Bit line 352, and bit line bar 354 are also shown. Note that the deep trench connectors 360*a*, 360*b* extend through the plane shown in diagram 300*b* of FIG. 3C, and extend to the VSS reference plane 340*a* at the bottom of the SRAM cell 302. The VSS reference planes 340*a*, 340*b*, at the bottom of the SRAM cell 302, are shown in diagram 300*b* of FIG. 3C for convenience.

FIG. 3C shows a cross section side view of the SRAM cell that includes a deep trench connector to electrically couple the top of an epitaxial layer with a backside contact metal, in accordance with various embodiments. Diagram 300*c* shows a top-down schematic of a plurality of SRAM cells that make up an SRAM array 301 that includes SRAM cell 302. A VSS source 340*a* is below the SRAM cell 302. Other VSS sources 340*b* are also located below other SRAM cells.

The lower diagram is a cross section of the cut A-A' of diagrams 300*a*, 300*b*. The VSS source 340*a* is shown below the NMOS epitaxial layers 310*a*-310*d*. In embodiments, the VSS connection 314*a* may be directly electrically coupled with the NMOS epitaxial layers 310*a*, 310*d*. In embodiments, the deep trench connector 360*a* extends from the VSS connection 314*a* down to the VSS reference plane 340*a*.

In embodiments, the VSS reference plane 340a may be part of a backside contact metal for the SRAM cell 302, or may be part of a backside metal zero (BM0) layer. In embodiments, there may be additional backside contact metal layers (not shown) between deep trench connector 360a and a BM0 layer. Note that in embodiments, the sides of the deep trench connector 360a may be adjacent to and/or physically coupled with the epitaxial layers 310a, 310b. In embodiments, there may be a dielectric or some other layer (not shown) that separates the VSS reference plane 340a from the bottom of the NMOS epitaxial layers 310a, 310d.

Note that unlike the legacy diagram 100c in FIG. 1C, there is no electrically conductive ring 132, nor are there any front side electrical couplings 130 required surrounding the SRAM array 301 in this embodiment. As a result, the electrical path between the VSS source 340a and a side of the NMOS epitaxial layers 310a, 310d is vastly shorter than legacy electrical path 136 of FIG. 1C. In addition, the absence of front side VSS electrical couplings 130 eliminates the layer-to-layer and inter-layer coupling capacitance between the bitline or word line and VSS routes.

FIG. 4 illustrates an example process for manufacturing an SRAM that includes an epitaxial layer that is electrically coupled with a backside contact metal, in accordance with various embodiments. Process 400 may be implemented using the apparatus, techniques, systems, and procedures discussed herein, and in particular with respect to FIGS. 1-3C. In embodiments, the SRAM may be similar to SRAM 202 of FIGS. 2A-2B.

At block 402, the process may include providing a backside contact metal. In embodiments, the backside contact metal may be similar to VSS source 240 of FIG. 2B.

At block 404, the process may further include forming a metal layer on the backside contact metal, wherein the metal layer is electrically coupled with the backside contact metal. In embodiments, the metal layer may be similar to VSS connections 214a of FIG. 2B.

At block 406, the process may further include forming a first epitaxial layer and a second epitaxial layer on the metal layer, wherein a side of the first epitaxial layer and a side of the second epitaxial layer are electrically coupled with the metal layer. In embodiments, the first epitaxial layer and the second epitaxial layer may be similar to epitaxial layers 210a, 210d of FIG. 2B.

Figure 5:
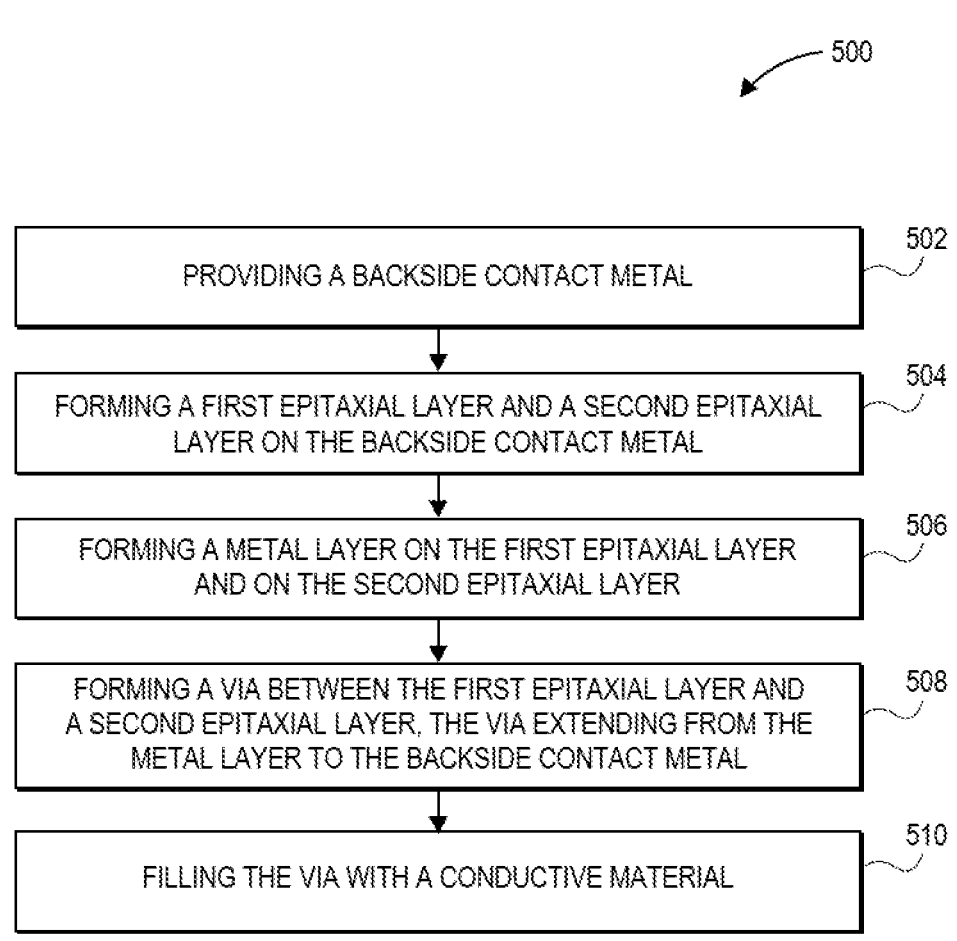
FIG. 5 illustrates an example process for manufacturing and SRAM that includes an epitaxial layer that is directly electrically coupled with a backside contact metal, in accordance with various embodiments FIGS. 6A-6B schematically illustrate a top view of an example die in wafer form and in singulated form, and a cross section side view of a package assembly, in accordance with various embodiments.

FIG. 5 illustrates an example process for manufacturing an SRAM that includes an epitaxial layer that is directly electrically coupled with a backside contact metal, in accordance with various embodiments. Process 500 may be implemented using the apparatus, techniques, systems, and procedures discussed herein, and in particular with respect to FIGS. 1-3C. In embodiments, the SRAM may be similar to SRAM 302 of FIGS. 3A-3C.

At block 502, the process may include providing a backside contact metal. In embodiments, the backside contact metal may be similar to VSS source 340a of FIGS. 3A-3C.

At block 504, the process may further include forming a first epitaxial layer and a second epitaxial layer on the backside contact metal. In embodiments, the first epitaxial layer may be similar to epitaxial layer 310a, and the second epitaxial layer may be similar to epitaxial layer 310d of FIGS. 3A-3C.

At block 506, the process may further include forming a metal layer on the first epitaxial layer and on the second epitaxial layer. In embodiments, the first metal layer may be similar to metal layer 314 of FIG. 3C.

At block 508, the process may further include forming a via between the first epitaxial layer and a second epitaxial layer, the via extending from the metal layer to the backside contact metal. In embodiments, the via may be similar to the via formed to create deep trench connector 360a of FIG. 3A-3C. In embodiments, the via may be formed using a drilling process, which may include either a physical drill or a laser drill.

At block 510, the process may further include filling the via with a conductive material. In embodiments, the filled via may be similar to deep trench connector 360a of FIG. 3A-3C. The via may be filled with a conductive material, a conductive metal, or a conductive alloy.

Figure 6A:
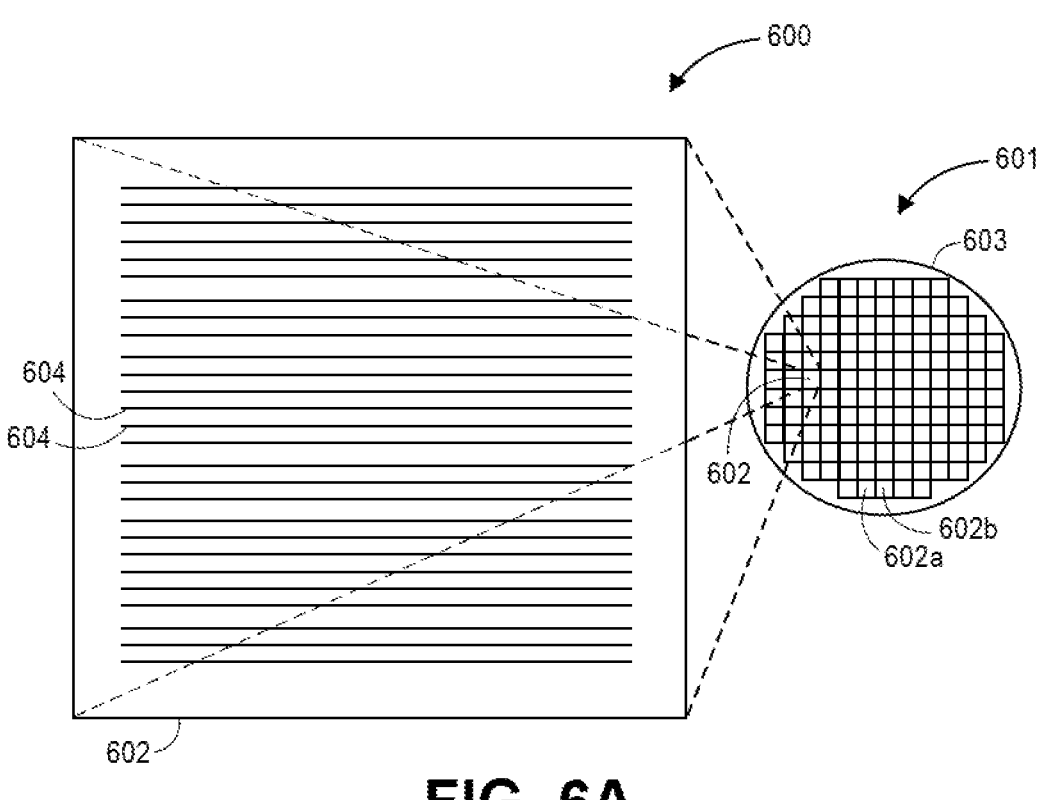
Figure 6B:
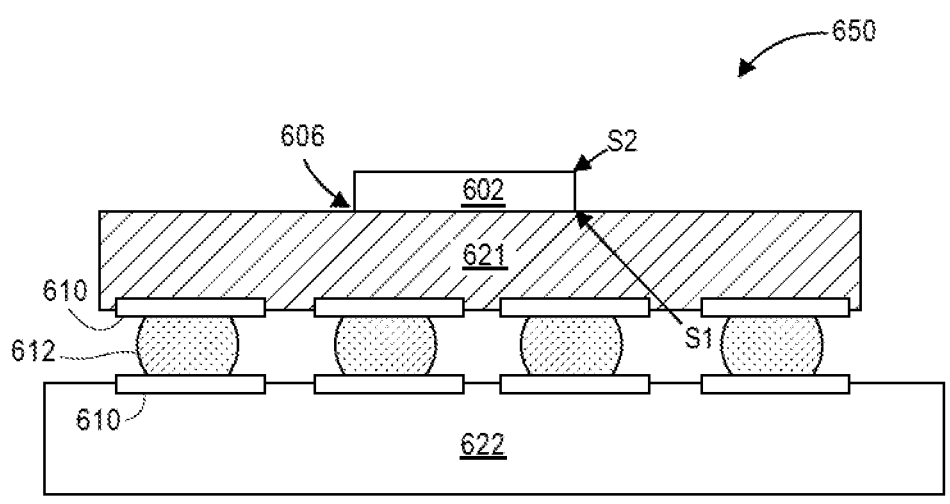

FIGS. 6A-6B schematically illustrate a top view of an example die in wafer form and in singulated form, and a cross section side view of a package assembly, in accordance with various embodiments. FIGS. 6A-6B schematically illustrate a top view of an example die in wafer form and in singulated form, and a cross section side view of a package assembly, in accordance with various embodiments. FIG. 6A schematically illustrates a top view of an example die 602 in a wafer form 601 and in a singulated form 600, in accordance with some embodiments. In some embodiments, die 602 may be one of a plurality of dies, e.g., dies 602, 602a, 602b, of a wafer 603 comprising semiconductor material, e.g., silicon or other suitable material. The plurality of dies, e.g., dies 602, 602a, 602b, may be formed on a surface of wafer 603. Each of the dies 602, 602a, 602b, may be a repeating unit of a semiconductor product that includes devices as described herein. For example, die 602 may include circuitry having elements such as capacitors and/or inductors 604 (e.g., fin structures, nanowires, and the like) that provide a channel pathway for mobile charge carriers in transistor devices. Although one or more capacitors and/or inductors 604 are depicted in rows that traverse a substantial portion of die 602, it is to be understood that one or more capacitors and/or inductors 604 may be configured in any of a wide variety of other suitable arrangements on die 602 in other embodiments.

After a fabrication process of the device embodied in the dies is complete, wafer 603 may undergo a singulation process in which each of dies, e.g., die 602, is separated from one another to provide discrete "chips" of the semiconductor product. Wafer 603 may be any of a variety of sizes. In some embodiments, wafer 603 has a diameter ranging from about 25.4 mm to about 450 mm. Wafer 603 may include other sizes and/or other shapes in other embodiments. According to various embodiments, the one or more capacitors and/or inductors 604 may be disposed on a semiconductor substrate in wafer form 601 or singulated form 600. One or more capacitors and/or inductors 604 described herein may be incorporated in die 602 for logic, memory, or combinations thereof. In some embodiments, one or more capacitors and/or inductors 604 may be part of a system-on-chip (SoC) assembly.

FIG. 6B schematically illustrates a cross-section side view of an integrated circuit (IC) assembly 650, in accordance with some embodiments. In some embodiments, IC assembly 650 may include one or more dies, e.g., die 602, electrically or physically coupled with a package substrate 621. Die 602 may include one or more capacitors and/or inductors 604 as described herein. In some embodiments, package substrate 621 may be electrically coupled with a circuit board 622 as is well known to a person of ordinary skill in the art. Die 602 may represent a discrete product made from a semiconductor material (e.g., silicon) using semiconductor fabrication techniques such as thin film deposition, lithography, etching, and the like. In some embodiments, die 602 may be, include, or be a part of a processor, memory, SoC or ASIC in some embodiments.

Die 602 can be attached to package substrate 621 according to a wide variety of suitable configurations including, for example, being directly coupled with package substrate 621 in a flip-chip configuration, as depicted. In the flip-chip configuration, an active side S1 of die 602 including circuitry is attached to a surface of package substrate 621 using hybrid bonding structures as described herein that may also electrically couple die 602 with package substrate 621. Active side S1 of die 602 may include multi-threshold voltage transistor devices as described herein. An inactive side S2 of die 602 may be disposed opposite to active side S1.

In some embodiments, package substrate 621 is an epoxy-based laminate substrate having a core and/or build-up layers such as, for example, an Ajinomoto Build-up Film (ABF) substrate. Package substrate 621 may include other suitable types of substrates in other embodiments including, for example, substrates formed from glass, ceramic, or semiconductor materials.

Package substrate 621 may include electrical routing features configured to route electrical signals to or from die 602. The electrical routing features may include pads or traces (not shown) disposed on one or more surfaces of package substrate 621 and/or internal routing features (not shown) such as trenches, vias, or other interconnect structures to route electrical signals through package substrate 621. In some embodiments, package substrate 621 may include electrical routing features such as pads (not shown) configured to receive the respective die-level interconnect structures 606 of die 602.

Circuit board 622 may be a printed circuit board (PCB) comprising an electrically insulative material such as an epoxy laminate. Circuit board 622 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures such as traces, trenches, vias may be formed through the electrically insulating layers to route the electrical signals of die 602 through circuit board 622. Circuit board 622 may comprise other suitable materials in other embodiments. In some embodiments, circuit board 622 is a motherboard as is well known to a person of ordinary skill in the art.

Package-level interconnects such as, for example, solder balls 612 may be coupled to one or more pads 610 on package substrate 621 and/or on circuit board 622 to form corresponding solder joints that are configured to further route the electrical signals between package substrate 621 and circuit board 622. Pads 610 may comprise any suitable electrically conductive material such as metal including, for example, nickel (Ni), palladium (Pd), gold (Au), silver (Ag), copper (Cu), and combinations thereof. Other suitable techniques to physically and/or electrically couple package substrate 621 with circuit board 622 may be used in other embodiments.

IC assembly 650 may include a wide variety of other suitable configurations in other embodiments including, for example, suitable combinations of flip-chip and/or wire-bonding configurations, interposers, multi-chip package configurations including system-in-package (SiP), and/or package-on-package (PoP) configurations. Other suitable techniques to route electrical signals between die 602 and other components of IC assembly 650 may be used in some embodiments.

A person of ordinary skill in the art should recognize that any known semiconductor device fabricated using any known semiconductor process that may benefit from the principles described herein.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
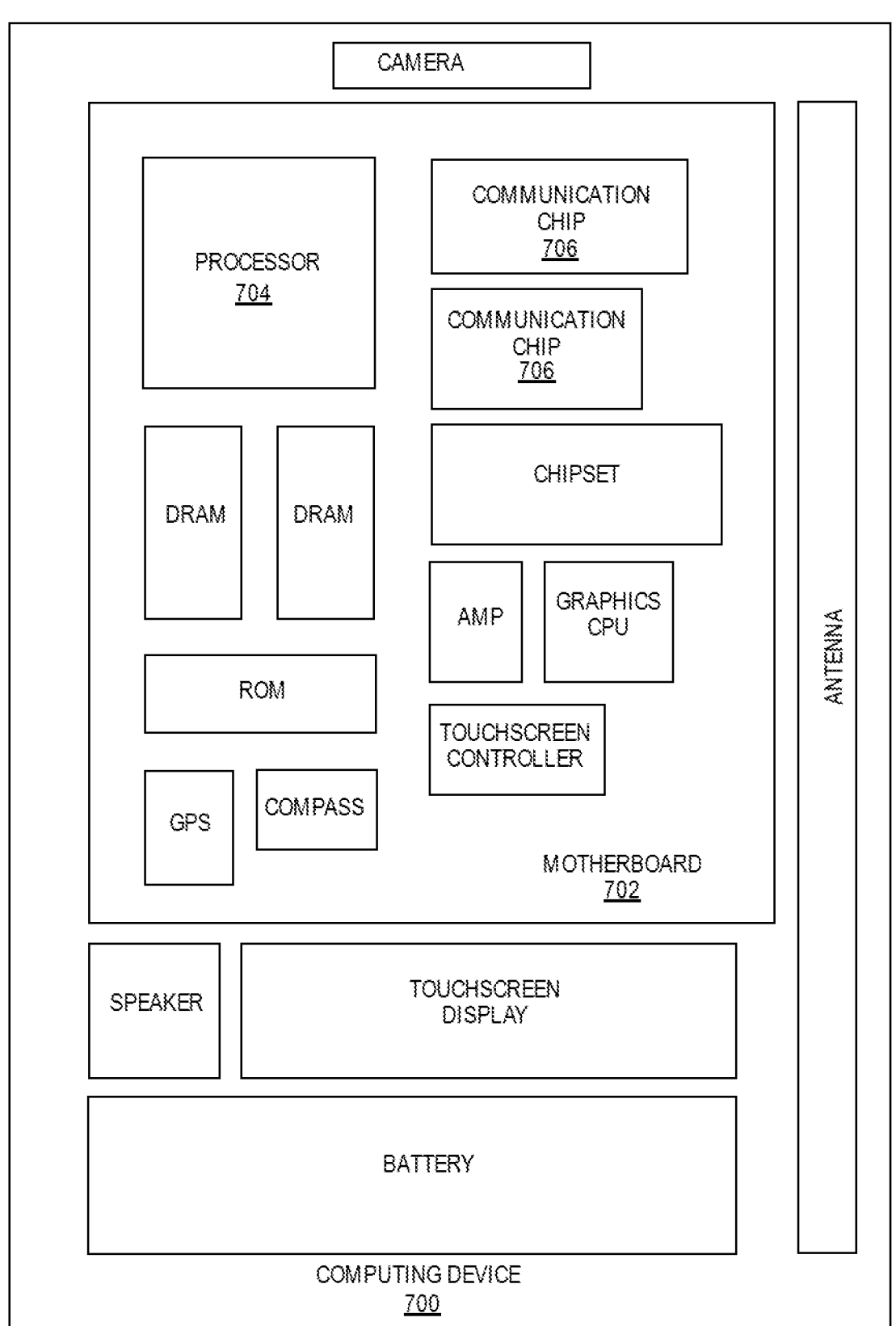
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
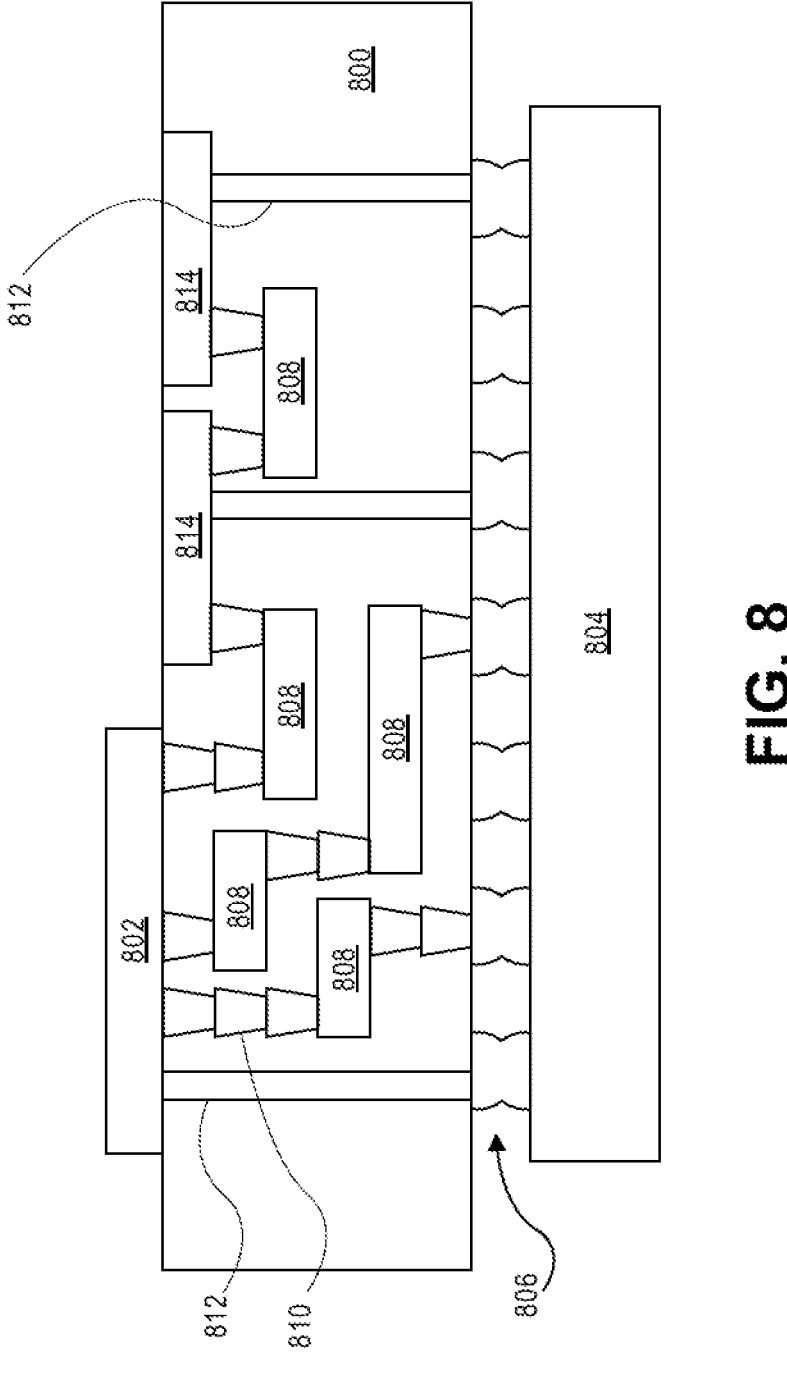
FIG. 8 illustrates an interposer that includes one or more embodiments of the invention.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a transistor comprising: a backside contact metal; an epitaxial layer on the backside contact metal; and wherein the backside contact metal is directly electrically coupled with the epitaxial layer and provides a voltage to the epitaxial layer during operation.

Example 2 includes the transistor of example 1, or of any other example or embodiment described herein, wherein the backside contact metal further includes: a first backside contact metal; and a second backside contact metal on the first backside contact metal and electrically coupled with the first backside contact metal, wherein the second backside contact metal is directly electrically coupled with the epitaxial layer and provides a voltage to the epitaxial layer during operation.

Example 3 includes the transistor of example 1, or of any other example or embodiment described herein, wherein the epitaxial layer includes a selected one or more of: one or more nanosheets, one or more nanowires, or one or more FinFET structures.

Example 4 includes the transistor of example 1, or of any other example or embodiment described herein, wherein the backside contact metal is electrically coupled with a voltage source supply (VSS).

Example 5 includes the transistor of example 1, or of any other example or embodiment described herein, further comprising a metal zero layer on top of the epitaxial layer.

Example 6 includes the transistor of example 1, or of any other example or embodiment described herein, wherein the transistor is a portion of a static random-access memory (SRAM) cell.

Example 7 includes the transistor of example 1, or of any other example or embodiment described herein, wherein the transistor is a first transistor, and the epitaxial layer is a first epitaxial layer; and further comprising: a second transistor including: a second epitaxial layer on the backside contact metal; and wherein the backside contact metal is directly electrically coupled with the second epitaxial layer and provides a voltage to the second epitaxial layer during operation.

Example 8 includes the transistor of example 1, or of any other example or embodiment described herein, wherein the epitaxial layer is part of an NMOS.

Example 9 includes the transistor of example 1, or of any other example or embodiment described herein, wherein the backside contact metal is on a substrate that includes silicon.

Example 10 is a transistor comprising: a backside contact metal; an epitaxial layer on the backside contact metal; a metal layer on top of the epitaxial layer and directly electrically coupled with the epitaxial layer; and an electrical contact extending from the metal layer to the backside contact metal and directly electrically couples the metal layer and the backside contact metal.

Example 11 includes the transistor of example 10, or of any other example or embodiment described herein, wherein the electrical contact is adjacent to a side of the epitaxial layer.

Example 12 includes the transistor of example 10, or of any other example or embodiment described herein, wherein the electrical contact is a via filled with an electrically conductive material.

Example 13 includes the transistor of example 12, or of any other example or embodiment described herein, wherein the electrically conductive material includes a metal.

Example 14 includes the transistor of example 10, or of any other example or embodiment described herein, wherein the epitaxial layer includes a selected one or more of: one or more nanosheets, one or more nanowires, or one or more FinFET structures.

Example 15 includes the transistor of example 10, or of any other example or embodiment described herein, wherein the backside contact metal is electrically coupled with a voltage source supply (VSS).

Example 16 includes the transistor of example 10, or of any other example or embodiment described herein, further comprising a metal zero layer on top of the epitaxial layer.

Example 17 includes the transistor of example 10, or of any other example or embodiment described herein, wherein the transistor is a portion of a static random-access memory (SRAM) cell.

Example 18 includes the transistor of example 10, or of any other example or embodiment described herein, wherein the epitaxial layer is a first epitaxial layer; and further comprising a second epitaxial layer on the backside contact metal; and wherein the metal layer is on top of the second epitaxial layer and directly electrically coupled with the second epitaxial layer.

Example 19 includes the transistor of example 18, or of any other example or embodiment described herein, wherein the electrical contact is adjacent to a side of the second epitaxial layer.

Example 20 includes the transistor of example 10, or of any other example or embodiment described herein, further comprising an electrical insulation layer between the backside contact metal and the epitaxial layer.

Example 21 includes the transistor of example 10, or of any other example or embodiment described herein, wherein the backside contact metal is on a substrate that includes silicon.

Example 22 is a memory cell comprising: a plurality of transistors, at least one of the transistors includes: a first backside contact metal; a second backside contact metal on the first backside contact metal and electrically coupled with the first backside contact metal; an epitaxial layer on and directly electrically coupled to the second backside contact metal; and wherein the backside contact metal provides a voltage to the epitaxial layer during operation.

Example 23 includes the memory cell of example 22, or of any other example or embodiment described herein, wherein the epitaxial layer includes a selected one or more of: one or more nanosheets, one or more nanowires, or one or more FinFET structures.

Example 24 includes the memory cell of example 22, or of any other example or embodiment described herein, wherein the backside contact metal is electrically coupled with a voltage source supply (VSS).

Example 25 includes a memory cell of example 22, or of any other example or embodiment described herein, wherein the memory cell is a first memory cell, the plurality of transistors is a first plurality of transistors; and further comprising: a second memory cell that includes a second plurality of transistors, at least one of the second plurality of transistors includes: an epitaxial layer on and directly electrically coupled to the second backside contact metal; and wherein the backside contact metal provides a voltage to the epitaxial layer of the at least one of the second plurality of transistors of during operation.

Example 26 is a method comprising: providing a backside contact metal; forming a first epitaxial layer and a second epitaxial layer on the backside contact metal; forming a metal layer on the first epitaxial layer and on the second epitaxial layer; forming a via between the first epitaxial layer and a second epitaxial layer, the via extending from the metal layer to the backside contact metal; and filling the via with a conductive material.

Example 27 may include the method of example 26, or of any other example or embodiment described herein, wherein forming a via further includes drilling the via using a selected one of: a laser drill or a mechanical drill.

Example 28 may include the method of example 26, or of any other example or embodiment described herein, wherein the conductive material includes a metal.

Example 29 may include the method of example 26, or of any other example or embodiment described herein, wherein the first epitaxial layer and the second epitaxial layer include a selected one or more of: one or more nanosheets, one or more nanowires, or one or more FinFET structures.

Example 30 may include the method of example 26, or of any other example or embodiment described herein, wherein providing the backside contact metal further includes providing the backside contact metal on a silicon substrate.

Example 31 is a method comprising: providing a backside contact metal; forming a metal layer on the backside contact metal, wherein the metal layer is electrically coupled with the backside contact metal; and forming a first epitaxial layer and a second epitaxial layer on the metal layer, wherein a side of the first epitaxial layer and a side of the second epitaxial layer are electrically coupled with the metal layer.

Example 32 may include the method of example 31, or of any other example or embodiment described herein, wherein the backside contact metal is a backside metal zero (BM0) layer.

Example 33 may include the method of example 31, or of any other example or embodiment described herein, wherein the metal layer includes a plurality of metal layers.

Example 34 may include the method of example 33, or of any other example or embodiment described herein, wherein the plurality of metal layers include a dielectric material between two of the plurality of metal layers.

Example 35 may include the method of example 31, or of any other example or embodiment described herein, wherein the first epitaxial layer and the second epitaxial layer include a selected one or more of: one or more nanosheets, one or more nanowires, or one or more FinFET structures.

What is claimed is:

1. A transistor comprising:
   a backside contact metal;
   an epitaxial layer laterally adjacent to the backside contact metal, wherein the backside contact metal is in contact with a sidewall of the epitaxial layer from a top of the epitaxial layer to a bottom of the epitaxial layer, and wherein the backside contact metal is between the epitaxial layer and a backside metal zero layer (BM0); and
   a metal zero layer on top of the epitaxial layer.

2. The transistor of claim 1, wherein the backside contact metal further includes:
   a first backside contact metal; and
   a second backside contact metal on the first backside contact metal and electrically coupled with the first backside contact metal, wherein the second backside contact metal is physically and electrically coupled with the epitaxial layer and provides a voltage to the epitaxial layer during operation.

3. The transistor of claim 1, wherein the backside contact metal is electrically coupled with a voltage source supply (VSS).

4. The transistor of claim 1, wherein the transistor is a portion of a static random-access memory (SRAM) cell.

5. The transistor of claim 1, wherein the transistor is a first transistor, and the epitaxial layer is a first epitaxial layer; and further comprising:

a second transistor including:

a second epitaxial layer on the backside contact metal; and wherein the backside contact metal is electrically coupled with the second epitaxial layer.

6. The transistor of claim 1, wherein the epitaxial layer is part of an NMOS.

7. The transistor of claim 1, wherein the backside contact metal is on a substrate that includes silicon.

8. A transistor comprising:

a backside contact metal;

an epitaxial layer laterally adjacent to the backside contact metal, wherein the backside contact metal is in contact with a sidewall of the epitaxial layer from a top of the epitaxial layer to a bottom of the epitaxial layer, and wherein the backside contact metal is between the epitaxial layer and a backside metal zero (BM0) layer; and a metal layer on top of the epitaxial layer and electrically coupled with the epitaxial layer.

9. The transistor of claim 8, wherein the backside contact metal is electrically coupled with a voltage source supply (VSS).

10. The transistor of claim 8, wherein the metal layer is a metal zero layer.

11. The transistor of claim 8, wherein the transistor is a portion of a static random-access memory (SRAM) cell.

12. The transistor of claim 8, wherein the epitaxial layer is a first epitaxial layer; and further comprising a second epitaxial layer on the backside contact metal; and wherein the metal layer is on top of the second epitaxial layer and electrically coupled with the second epitaxial layer.

13. The transistor of claim 8, further comprising an electrical insulation layer between the backside contact metal and the epitaxial layer.

14. The transistor of claim 8, wherein the backside contact metal is on a substrate that includes silicon.

15. A memory cell comprising:

a plurality of transistors, at least one of the transistors includes:

a first backside contact metal;

a second backside contact metal on the first backside contact metal and electrically coupled with the first backside contact metal;

an epitaxial layer adjacent to and electrically coupled to the second backside contact metal, wherein the second backside contact metal is in contact with a sidewall of the epitaxial layer from a top of the epitaxial layer to a bottom of the epitaxial layer, and wherein the first backside contact metal is a backside metal zero (BM0) layer; and a metal zero layer on top of the epitaxial layer.

16. The memory cell of claim 15, wherein the first backside contact metal is electrically coupled with a voltage source supply (VSS).

17. The memory cell of claim 15, wherein the memory cell is a first memory cell, the plurality of transistors is a first plurality of transistors; and further comprising:

a second memory cell that includes a second plurality of transistors, at least one of the second plurality of transistors includes an epitaxial layer on and electrically coupled to the second backside contact metal.

* * * * *